(12) United States Patent
Wei et al.

(10) Patent No.: US 11,556,162 B2
(45) Date of Patent: Jan. 17, 2023

(54) PER-INSTRUCTION ENERGY DEBUGGING USING INSTRUCTION SAMPLING HARDWARE

(71) Applicant: Advanced Micro Devices, Inc., Santa Clara, CA (US)

(72) Inventors: Shijia Wei, Austin, TX (US); Joseph L. Greathouse, Austin, TX (US); John Kalamatianos, Arlington, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 350 days.

(21) Appl. No.: 15/923,153

(22) Filed: Mar. 16, 2018

(65) Prior Publication Data

US 2019/0286209 A1    Sep. 19, 2019

(51) Int. Cl.
  *G06F 1/32*      (2019.01)
  *G06F 9/38*      (2018.01)
  *G06F 11/36*     (2006.01)

(52) U.S. Cl.
  CPC ............. *G06F 1/32* (2013.01); *G06F 9/3891* (2013.01); *G06F 11/3664* (2013.01)

(58) Field of Classification Search
  USPC ............ 703/14, 19, 22, 24; 716/103; 712/20
  See application file for complete search history.

(56) References Cited

U.S. PATENT DOCUMENTS

| | | | |
|---|---|---|---|
| 6,058,066 A * | 5/2000 | Norris | H03K 23/68 365/230.05 |
| 8,356,165 B2 | 1/2013 | Tye et al. | |
| 8,887,168 B2 | 11/2014 | Yu | |
| 9,535,488 B2 * | 1/2017 | Henry | G06F 1/3203 |
| 9,547,353 B1 * | 1/2017 | Marr | G06F 1/3206 |
| 10,915,319 B2 * | 2/2021 | Meixner | G06F 3/007 |
| 2005/0204316 A1 * | 9/2005 | Nebel | G06F 30/33 716/103 |
| 2007/0208981 A1 * | 9/2007 | Restrepo | H02H 1/0015 714/731 |

(Continued)

OTHER PUBLICATIONS

AMD White Paper, "Advanced Power Management Helps Bring Improved Performance to Highly Integrated X86 Processors," 2014, pp. 1-9.

(Continued)

*Primary Examiner* — Thai Q Phan
(74) *Attorney, Agent, or Firm* — Zagorin Cave LLP (57) ABSTRACT

A processor utilizes instruction based sampling to generate sampling data sampled on a per instruction basis during execution of an instruction. The sampling data indicates what processor hardware was used due to the execution of the instruction. Software receives the sampling data and generates an estimate of energy used by the instruction based on the sampling data. The sampling data may include microarchitectural events and the energy estimate utilizes a base energy amount corresponding to the instruction executed along with energy amounts corresponding to the microarchitectural events in the sampling data. The sampling data may include switching events associated with hardware blocks that switched due to execution of the instruction and the energy estimate for the instruction is based on the switching events and capacitance estimates associated with the hardware blocks.

20 Claims, 7 Drawing Sheets

(56) References Cited

U.S. PATENT DOCUMENTS

| | | | | |
|---|---|---|---|---|
| 2009/0083705 | A1* | 3/2009 | Phillips | G06F 8/71 |
| | | | | 717/113 |
| 2009/0259869 | A1 | 10/2009 | Naffziger | |
| 2010/0185416 | A1* | 7/2010 | Furem | E02F 9/2054 |
| | | | | 702/184 |
| 2013/0145132 | A1* | 6/2013 | Moritz | G06F 1/32 |
| | | | | 712/220 |
| 2013/0346926 | A1* | 12/2013 | Pandurangan | G06F 30/33 |
| | | | | 716/102 |
| 2014/0358472 | A1* | 12/2014 | Goel | A61B 5/1118 |
| | | | | 702/141 |
| 2015/0052340 | A1* | 2/2015 | Fuks | G06F 9/4401 |
| | | | | 713/1 |
| 2015/0121048 | A1* | 4/2015 | Lukefahr | G06F 9/3891 |
| | | | | 712/229 |
| 2015/0160274 | A1* | 6/2015 | Obara | G01R 21/133 |
| | | | | 702/61 |
| 2016/0085526 | A1* | 3/2016 | Moritz | G06F 8/44 |
| | | | | 717/158 |
| 2016/0370843 | A1* | 12/2016 | Gatson | G06F 1/3206 |
| 2017/0077912 | A1* | 3/2017 | Fu | H02M 3/158 |
| 2017/0115348 | A1* | 4/2017 | Schelle | G01R 31/31703 |
| 2017/0147228 | A1* | 5/2017 | Yudanov | G06F 12/08 |
| 2018/0101466 | A1* | 4/2018 | O'Dowd | G06F 11/323 |
| 2018/0129589 | A1* | 5/2018 | O'Dowd | G06F 11/3664 |
| 2018/0329479 | A1* | 11/2018 | Meixner | G06F 9/30032 |
| 2019/0007354 | A1* | 1/2019 | Bulut | G16H 40/63 |
| 2019/0286971 | A1* | 9/2019 | Che | G06N 3/084 |

OTHER PUBLICATIONS

Bircher, W. L. and John, L. K., "Complete System Power Estimation: A Trickle-Down Approach Based on Performance Events," ISPASS 2007, pp. 158-168.

Chen, J. et al., "Watts-inside: A Hardware-Software Cooperative Approach for Multicore Power Debugging," ICCD 2013, pp. 335-342.

Chen, J. and Venkataramani, G., "enDebug: A Hardware-Software Framework for Automated Energy Debugging," JPDC 2016, pp. 121-133.

Drongowski, P. J., "Instruction-Based Sampling: A New Performance Analysis Technique for AMD Family 10h Processors," AMD CodeAnalyst Project, Nov. 16, 2007, 14 pages.

Hackenberg, D. et al., "An Energy Efficiency Feature Survey of the Intel Haswell Processor," IPDPSW 2015, 9 pages.

Hähnel, M. et al., "Measuring Energy Consumption for Short Code Paths Using RAPL," Greenmetrics 2012, 5 pages.

Isci, C. and Martonosi, M., "Runtime Power Monitoring in High-End Processors: Methodology and Empirical Data," MICRO 2003, 12 pages.

Joseph, R. and Martonosi, M., "Run-time Power Estimation in High Performance Microprocessors," ISLPED 2001, 6 pages.

Laros, J. H. III, et al., "PowerInsight—A Commodity Power Measurement Capability," IGCC 2013, 6 pages.

Li, D. et al., "Calculating Source Line Level Energy Information for Android Applications," ISSTA 2013, 12 pages.

Ofek, D., "Power Profiling, Shader Analysis & More with AMD CodeXL 1.7," http://youtu.be/Ep-ly-g0XU, May 19, 2015, (video).

Su, B. et al., "PPEP: Online Performance, Power, and Energy Prediction Framework and DVFS Space Exploration," Published at Micro 2014, 13 pages.

Tiwari, V. et al., "Instruction Level Power Analysis and Optimization of Software," ICVD 1996, pp. 326-328.

Wu, W. et al., "A Systematic Method for Functional Unit Power Estimation in Microprocessors" DAC 2006, pp. 554-557.

* cited by examiner

```
// uint64_t array[]
uint64_t i = 0;
while (array[i] != '\0') {
    if (array[i] %2 == 0)
        array[i]++;
    i++;
}
```

Fig. 1

```
        ; array base_addr in %rbx
        mov %rcx, -8
a:      add %rcx, 8
        mov %r9, (%rbx, %rcx, 0)
        cmp %r9, 0
        jz done
        mov %rax, (%rbx, %rcx, 0)   ;load memory buffer 2nd time
        mov %rdx, 0
        mov $r8, 2                  ;loop invariant data move
        div %r8                     ;expensive divide instruction
        cmp %rdx, 0
        jnz a
        inc (%rbx, %rcx, 0)         ;read memory buffer 3rd time
        jmp a
done:
```

Fig. 2

```
;       instruction                   Energy
        mov %rcx, -8                ; 3
a:      add %rcx, 8                 ; 1000
        mov %r9, (%rbx, %rcx, 0)    ; 250,000
        cmp %r9, 0                  ; 1000
        jz done                     ; 500
        mov %rax, (%rbx, %rcx, 0)   ; 50,000
        mov %rdx, 0                 ; 300
        mov $r8, 2                  ; 1000
        div %r8                     ; 80,000
        cmp %rdx, 0                 ; 1000
        jnz a                       ; 10,000
        inc (%rbx, %rcx, 0)         ; 100,000
        jmp a                       ; 400
done:
```

Fig. 3

```
; array base_addr in %rbx
        mov %rcx, -8
a:      add %rcx, 8
        mov %rax, (%rbx, %rcx, 0)
        cmp %rax, 0
        jz done
        and %rax, 1
        jnz a
        inc %rax
        mov (%rbx, %rcx, 0), %rax
        jmp a
done:
```

| RIP Virtual Address | Issue-Retirement Delay | Completion-Retirement Delay | Branch target address | Cache miss latency | TLB miss latency |
|---|---|---|---|---|---|
| Number of outstanding memory accesses | Virtual address of memory access | Physical address of memory access | Mispredicted branch? | Fused branch? | Taken branch? |
| Op was micro-coded? | L1TLB hit? | Op was load? | Op was store? | L1D hit? | L2 hit? |
| Branch target address? | L2TLB hit? | Memory Page size | NUMA location | Mem width | SW prefetch? |
| Op was a branch? | Op was a return? | Op was a resync? | | | |

PER-INSTRUCTION ENERGY DEBUGGING USING INSTRUCTION SAMPLING HARDWARE

STATEMENT REGARDING FEDERALLY SPONSORED RESEARCH OR DEVELOPMENT

This invention was made with Government support under the PathForward Project with Lawrence Livermore National Security (Prime Contract No. DE-AC52-07NA27344, Subcontract No. B620717) awarded by DOE. The Government has certain rights in this invention.

BACKGROUND

Description of the Related Art

Energy and power is one of the chief constraints in computing systems today. Lowering energy usage increases battery life, reduces heat and fan noise, and can increase performance by allowing processors to boost their frequency for longer periods. Hardware designers put a significant amount of work into reducing energy usage in their processors. For example, microarchitectural features like micro-operation caches can prevent the need for energy expensive operations like instruction decodes. Similarly, a great deal of effort goes into reducing the amount of switching activity in the circuits of a processor to reduce the amount of dynamic energy spent during an operation.

It is of increasing importance that software developers create code that is energy efficient. Energy-inefficient applications run down batteries faster, cause chips to run hotter, and make fans spin faster. Perhaps more insidiously, energy inefficient applications can run slower, since their higher power usage and resulting high temperatures can cause processors to run at lower frequencies. While it is in the general best interest to increase the energy efficiency of both hardware and software, software developers have much less visibility into inefficient energy usage associated with software than hardware developers do with inefficient energy usage by hardware.

Some existing processors offer software-visible interfaces to read processor power usage. For example, processors include interfaces that provide the amount of energy a core has used. However, these interfaces are updated infrequently (e.g., every 1 ms) and thus are not suitable for mapping energy to individual instructions. Tools exist that take these samples and map them to much longer 100 ms granularities. That can show how an application's power usage changes over time, but it can be difficult to debug high energy usage problems associated with single lines of code. Mapping millisecond-level granularity measurements to particular functions of a software program does not provide an accurate mechanism. Tools that add power monitoring hardware outside of the core suffer from similar issues.

Research has described how to write micro-benchmarks to map static instructions to energy on older microprocessors, microcontrollers, and DSPs. That allowed looking at an application and estimating those areas of code that could use large amounts of energy. That approach explicitly ignored runtime effects (such as how cache misses may use more energy than hits) because researchers found, at the time, that runtime effects had only secondary effects on energy. That is no longer the case—the dynamic actions a processor performs, and the number of times instructions perform them, are both vitally important for energy debugging.

Many research works have shown how to correlate hardware performance counter readings with total processor power usage. These models often take high-energy events, such as cache misses and branch mispredictions, and multiply their total counters by empirically derived weights. That can be useful to gather coarse-grained power information about an application, but it is much harder to use this data to pinpoint individual lines of code (or data structures) associated with high power and energy making such techniques insufficient for software energy debugging purposes.

Microarchitectural simulation frameworks can provide energy data but such models have the disadvantage of running much slower than real hardware runs (e.g., they may be thousands of times slower than a real execution) and can be inaccurate because of outdated power models.

Accordingly, improved techniques to identify energy inefficiencies in software can help developers generate more energy efficient software applications.

SUMMARY OF EMBODIMENTS OF THE INVENTION

Accordingly, in one embodiment a method includes sampling data in a processor on a per instruction basis during execution of an instruction to generate sampling data for the instruction, the sampling data indicating utilization of processor hardware due to the execution of the instruction. The method further includes determining an estimate of energy utilized by the execution of the instruction based on the sampling data for the instruction.

In another embodiment a non-transitory computer-readable storage medium embodies computer readable program code that includes computer executable instructions operable when executed to determine an estimate of an amount of energy utilized by an instruction executed on a processor based on sampling data determined during execution of the instruction, the sampling data including an indication of processor hardware utilized due to the execution of the instruction.

In another embodiment a system includes a processor configured to generate per instruction sampling data, the sampling data including a plurality of fields indicating processor hardware utilized due to execution of an instruction on the processor. The system further includes non-transitory, computer-readable storage medium embodying computer program code including computer executable instructions operable when executed to determine an estimate of energy used by the instruction based on the sampling data.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Embodiments described herein use performance monitoring hardware to determine application energy usage on a per-instruction basis. By matching hardware-gathered samples of executed instructions and indicators of how these instructions used the microarchitecture, accurate energy usage can be assigned to static instructions and particular lines of source code. Per instruction approaches described herein allow software developers to reduce the energy usage of their applications by directing them to the instruction(s) that use the most energy. Unlike power analysis tools that measure power from voltage regulators or which use traditional hardware performance counters that count such events as cache misses and branch mispredictions, embodiments identify individual instructions, lines of code, or data structures that could be improved to reduce the software application's energy usage on processors. The ability to identify individual instructions, lines of code, or data structures as described herein can be applied to various instruction set architectures (ISAs) incorporating the capabilities described herein. By passing energy usage information back to developers, software developers can help make software energy efficiency gains part of overall system efficiency gains.

Figure 1:
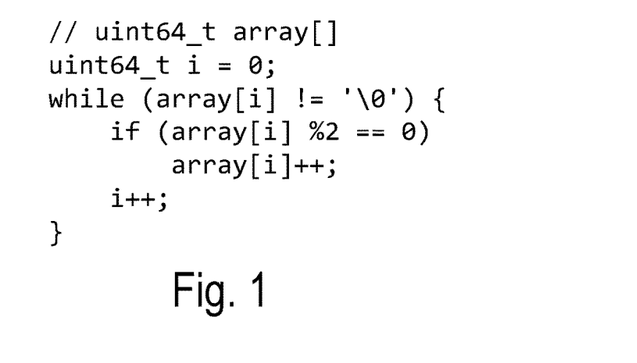
FIG. 1 shows an example of high level code.
Figure 2:
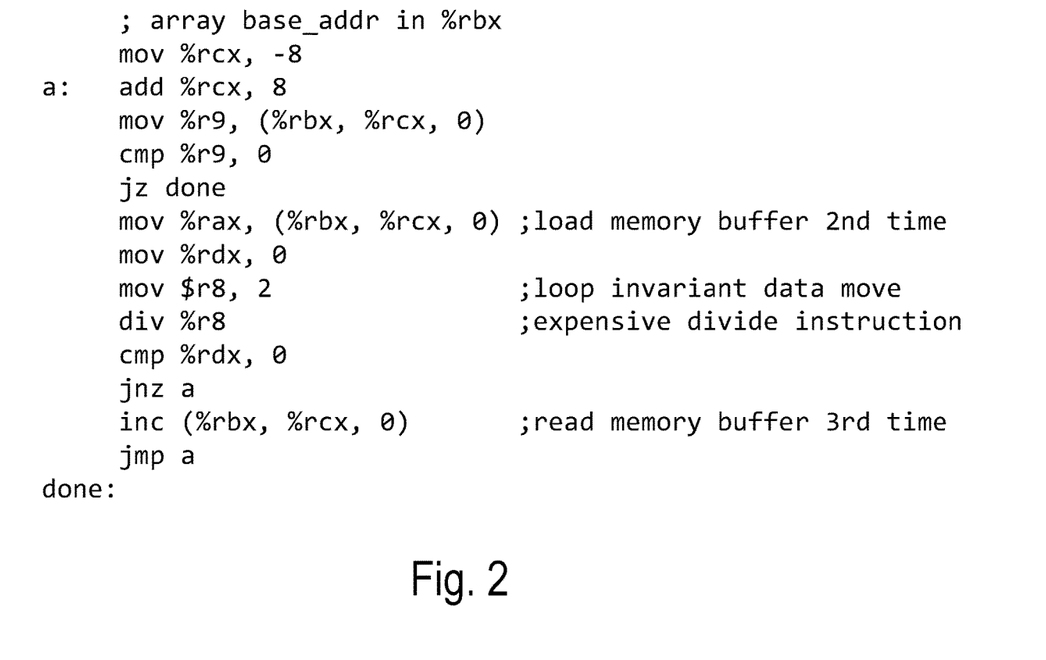
FIG. 2 illustrates assembly instructions implementing the high level code of FIG. 1.

FIGS. 1-4 provide a simple example of how code can be improved to be more energy efficient. FIG. 1 shows an example of high level code and FIG. 2 illustrates assembly instructions implementing the high level code. While an optimizing compiler might not create assembly as simple as shown in FIG. 2, the code in FIG. 2 serves as an illustration of the advantages of debugging application energy usage. The code segments have a loop that walks through a NULL-terminated array and increments all of the even values. Some of the instructions, while semantically correct, may needlessly burn energy. For example, array[i] is loaded more than once, which may burn additional energy in the load store queue (LSQ), data cache, and translation lookaside buffer (TLB). The comments associated with the assembly code (e.g. "loop invariant data move") denote some assembly instructions that may be wasting energy. The value of the divisor 2, is loaded into register r8 every time through the loop, even though it is invariant. The loop uses an integer divide instruction to perform the modulus operation, which can be performed more cheaply.

An application developer can have difficulty understanding these problems, even if they are familiar with reading assembly code. Some microarchitectures may be affected by these inefficiencies more than others. The repeated loads from array[i] may be bypassed in the load store queue (LSQ), meaning the repeated loads are not the major energy user. Additionally, software developers may not know the energy differences associated with a load and a divide. That means that developers may be unsure which problem to approach first (assuming they know that either are a potential problem).

Beyond finding out which static instructions use the most energy, dynamic information about the instructions' operation is hard to map to energy usage. If, for instance, the "jnz a" instruction was frequently mispredicted by a particular microprocessor design, it may end up consuming much more energy than the very similar "jz done".

Figure 3:
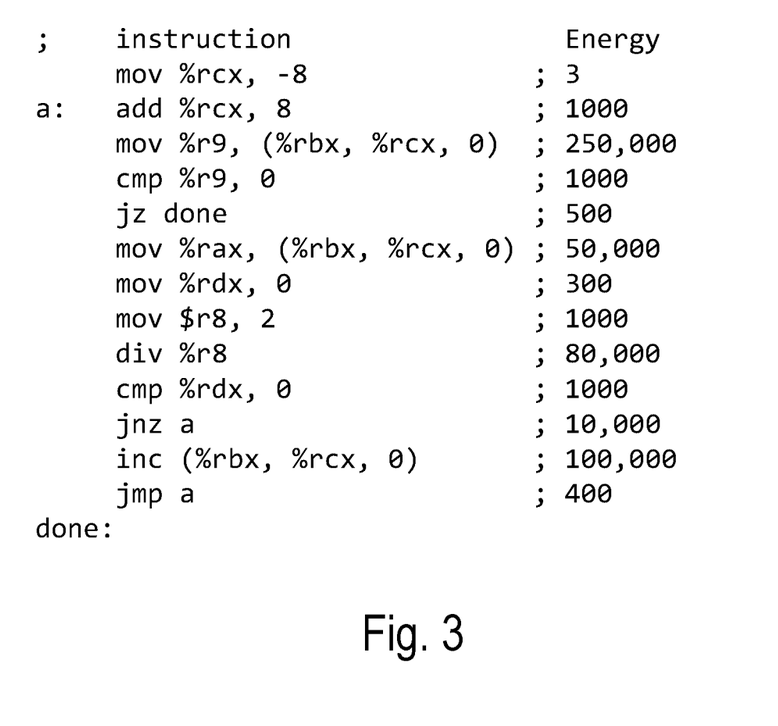
FIG. 3 illustrates an example of how energy usage may be provided on a per-instruction basis.
Figure 4:
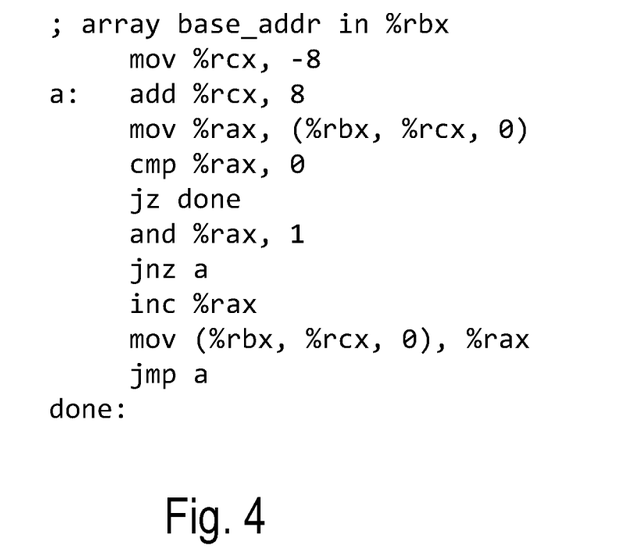
FIG. 4 illustrates code modified to be more energy efficient based on the energy usage of the original code.

Developers lack sufficient information on per instruction energy usage making it harder to optimize software applications for more energy efficiency. Ideally, an analysis tool could point out (on a per-instruction or per-line basis) where energy is spent. FIG. 3 illustrates a simple case of how such energy usage could be provided on a per-instruction basis and FIG. 4 illustrates how that information could be used to optimize the application. Such an energy breakdown would allow developers to see that the repeated loads (mov % r9, (% rbx, % rcx, 0); mov % rax, (% rbx, % rcx, 0)), the divide instruction, and the potentially mis-predicted branch are possible energy wastes, while the moves into rdx and r8 are less fruitful optimization points. By focusing on these particular high-energy instructions, a developer who is optimizing this code may rewrite it (or direct their compiler to regenerate it) into something like the code shown in FIG. 4. Note that even though these code optimizations may improve both performance and energy (e.g. by eliminating long-latency divide instructions with low-latency logical operations), there is still benefit in providing energy cost per instruction to software developers because they can focus on optimizations that benefit both performance and power as opposed to those that benefit performance at the expense of power or just power. For example, aggressive loop unrolling can hurt micro-op cache performance by making hot loops too large to fit in the micro-op cache.

Approaches that provide software tools allowing developers to optimize for both energy and performance let software developers focus on optimizing performance per watt (and not just performance) of their applications on hardware. Providing per instruction energy debugging capability provides a better processor platform solution. Embodiments described herein provide a mechanism to gather and present to users the energy debugging data for software executing on processors without large area, runtime, or design complexity overheads.

In order to provide appropriate information on instruction level energy usage, embodiments use detailed samples of data about instruction execution to estimate the energy used by instructions in an application. Estimating energy used by instructions can use hardware monitoring mechanisms that gather microarchitectural events associated with a particular executed instruction's address. Embodiments utilize an instruction based sampling (IBS) mechanism. The information available in instruction based samples can be used to understand where (in the application), where (in the processor), and when (in time) energy is spent in an application's execution at a per-instruction, per-function, per application, etc. granularity.

A typical processor pipeline has two main phases: instruction fetch and instruction execution. The fetch phase supplies instructions to the decoder. Decoded instructions are executed during the execution phase as discrete operations called "ops." Since the two phases are decoupled, embodiments of instruction based sampling provide two forms of sampling: fetch sampling and op sampling. Fetch sampling provides information about the fetch phase and op sampling provides information about the execution phase. Other embodiments may only use op sampling.

Figure 5:
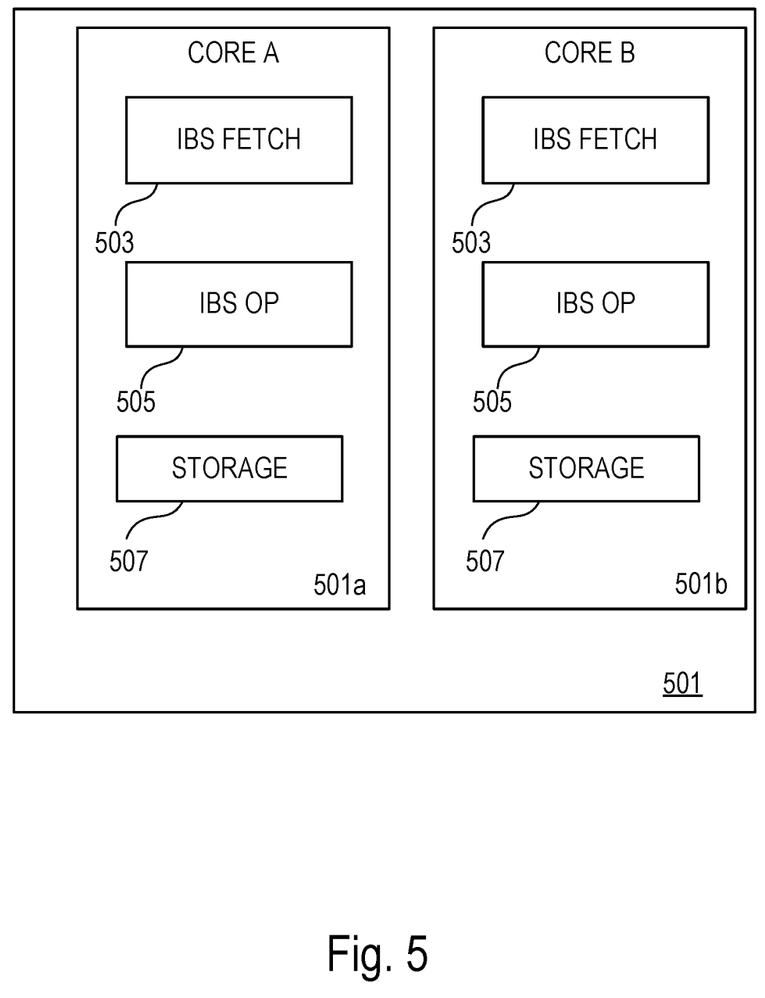
FIG. 5 illustrates a processor with two cores that provide instruction based sampling for both the instruction fetch (front end) and execution (backend).

FIG. 5 shows a processor 501 including cores 501a and 501b. The cores may be, e.g., central processing units (CPUs) or graphics processing units (GPUs). The number of cores is exemplary. Each of the cores 501a and 501b include a fetch control register 503 and an operation (Op) control register 505, to provide control for instruction based sampling for both the instruction fetch (front end) and execution (backend). Embodiments of instruction based sampling allows users to set a sample rate, N, and the sampling hardware 'marks' the $N^{th}$ fetched instruction or the $N^{th}$ micro-op that is issued into the core's out-of-order back-end. As the marked operation flows through the core, the hardware saves information about how the marked operation used the hardware into registers (or other storage locations) 507 in the processor.

Figure 6:
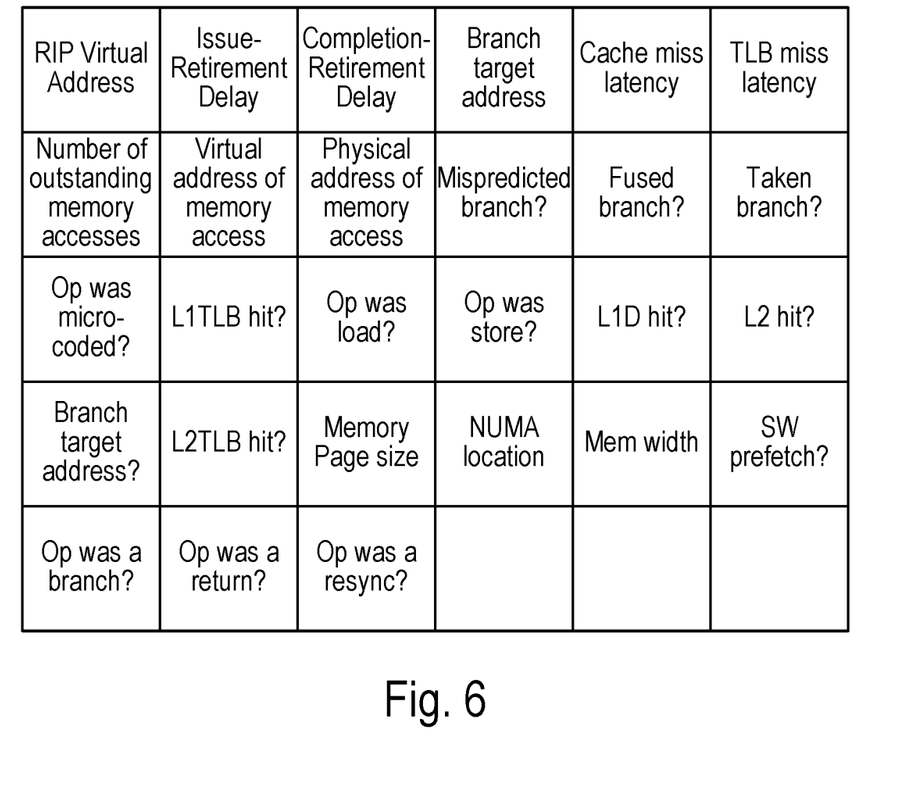
FIG. 6 illustrates examples of sample data gathered about every sampled micro-operation using an instruction based sample system.

FIG. 6 illustrates examples of back end sample data gathered about every sampled micro-operation using an instruction based sampling system. Front-end (fetch phase) sampling can gather additional data about instruction execution and therefore software energy usage. The sample data indicates, e.g., whether a marked instruction such as a load caused an L1 or L2 cache miss, whether the load hit in the TLB, and the sample data also tracks an indication of the instruction executed such as the instruction pointer. When the operation commits, core hardware causes an interrupt and a driver saves all of the sampled data to storage 507. Note that the sample data can instead be logged into storage by hardware rather than a driver depending on the specific implementation of instruction based sampling.

Importantly, each instruction based sample contains information, illustrated by way of example in FIG. 6, related to microarchitectural events associated with execution of a particular instruction. Other instruction sampling implementations may sample more or less information. All of the information in a sample represents data about an individual dynamic execution of a particular operation. In contrast, regular performance counters found in processors track the frequency of specific events for all operations, while instruction based sampling gathers a large set of different events for the sampled operation.

Over a large enough set of samples, it is possible to understand what an application did as it executed. If, for instance, instruction based sampling gathered 1 million samples and 500K were from a small section of code, nearly one half of the total instructions executed were from that code section. Similarly, if an operation in that section was a load, and 100,000 of its samples were marked as cache misses, then it is likely that instruction has a cache miss ratio of 20%.

Figure 7:
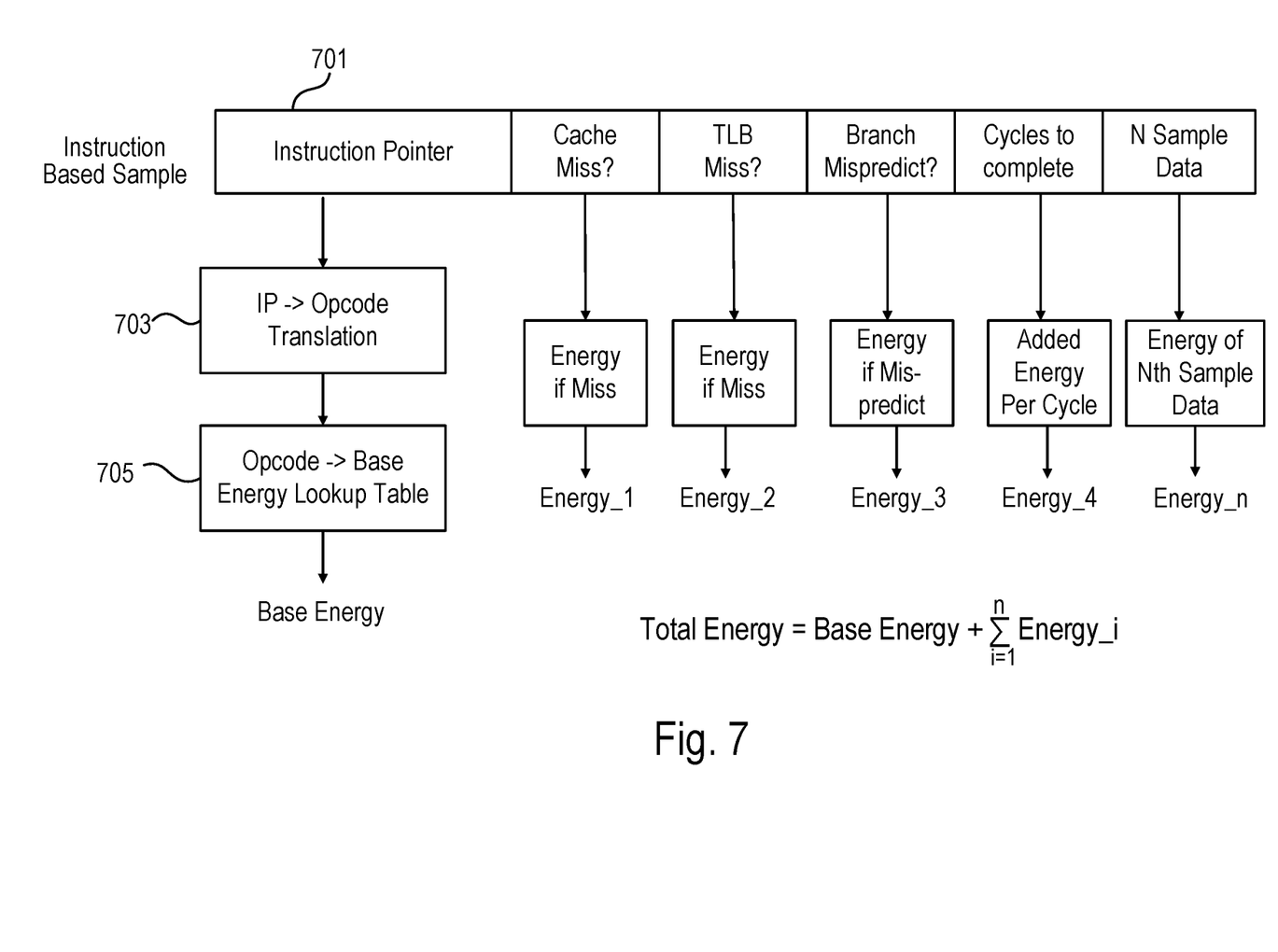
FIG. 7 illustrates an exemplary flow diagram for estimating an operation's energy consumption using instruction based sampling.

While the information in instruction based samples does not give energy readings, embodiments utilize details on microarchitectural events associated with instruction execution provided in the sample data to estimate the energy consumed by that instruction. FIG. 7 illustrates an exemplary flow diagram for estimating an operation's energy consumption using instruction based sampling. First, the instruction based sample data contains the indication of the instruction executed such as the instruction pointer 701 for the sample. Instruction based samples can contain instead of, or in addition to the instruction pointer 701, the opcode, another identifier of the instruction, or an identifier of the micro-op that is being sampled. The instruction pointer can be used to find the actual instruction executed, e.g., by recording the bytes at that instruction pointer as part of the sample data, or by later looking them up in the executable binary file. The base energy used by the instruction can be looked up in a table based on the opcode. Once the opcode is determined at 703, the opcode is used to look up the base amount of energy used by the instruction in 705. In addition, the information contained in the sample can be used to determine what additional energy, if any, the instruction execution used based on how the instruction used the core. For instance, a memory operation may use X picoJoules (pJ) by default, X+Y pJ if the sample shows an L1 cache miss, and X+Y+Z pJ if the sample also shows a TLB miss. The microarchitectural usage details in the sample data can thus be multiplied by energy weights and added to the base energy. The energy weights can be determined by simulation, empirically, or a combination. For example, circuit-level, RTL-level, or architectural-level simulation techniques can be used to estimate how much energy a design would use when particular events take place. Alternately, one could empirically measure each particular design under various operating conditions using microbenchmarks to understand how microarchitectural events are associated with energy usage. Adding together the various energy weights associated with the microarchitectural details of instruction execution provides an estimate of the energy for each sampled instruction. Thus, for the sampled instruction, the total energy used is:

$$\text{Total Energy} = \text{Base Energy} + \Sigma_{i=1}^{n} \text{Energy}\_i.$$

A code developer specifies when to sample, e.g., by specifying a sampling frequency (e.g., every 1000 ops) and runs the code to be energy debugged on a processor. Various embodiments can have different sampling capabilities. For example, certain embodiments may allow sampling every N ops (or every N instructions for the front-end of the core). However, other embodiments may provide additional or different sampling capabilities. For example, embodiments may allow sampling of every $N^{th}$ op of a particular type, every $N^{th}$ op that utilizes a particular hardware resource, and/or every $N^{th}$ op within a particular range or ranges of addresses. It is also possible to configure a system to sample whatever is happening every $N^{th}$ clock cycle. Once the sampling is complete, the sampled data functions as an input into software that operates in accordance with the flow chart of FIG. 7 to generate the energy estimate associated with that sampled instruction. The energy estimate can be provided to the programmer, e.g., as a cumulative value for the instruction, e.g., as shown in FIG. 3, or in greater detail with the individual components making up the energy utilization, e.g., base instruction, cache miss, etc., being presented to the application developer. From the samples generated, embodiments of the software that operate in accordance with FIG. 7 can provide average, peak, median energy and other statistical measures grouped by opcode, address, time, data structure, etc., to get statistical information for related samples. The more information provided to the software developer, the more help in energy debugging a particular application. Samples can be stored in a structured database and queried with standard techniques such as using Structured Query Language (SQL). This information can also be used to trace energy usage over time, and power over ranges of time.

Figure 8:
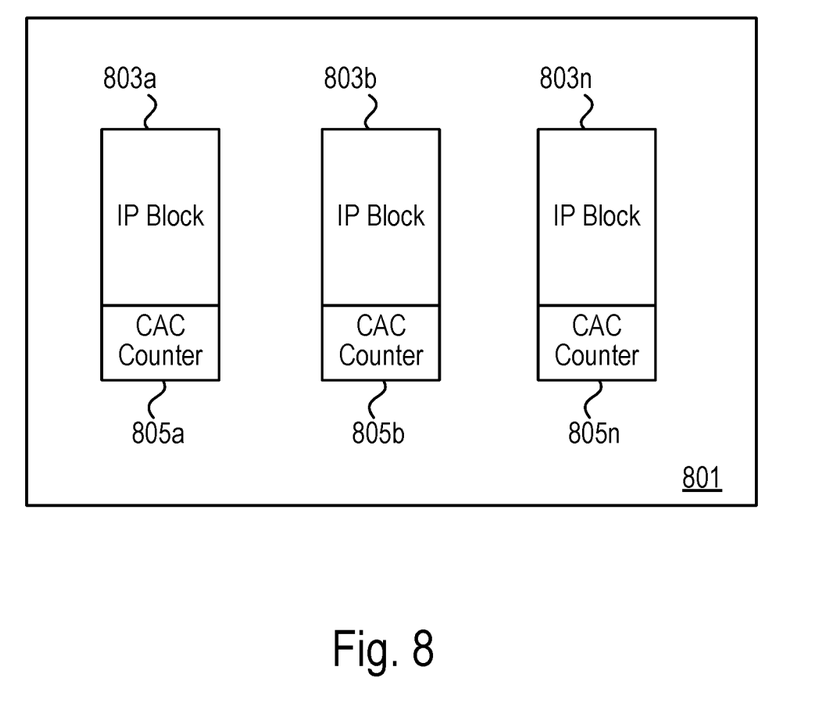
FIG. 8 illustrates an embodiment of a processor with IP blocks and associated $C_{AC}$ switching counters.

Another embodiment estimates the amount of energy used by an instruction or micro-op that was sampled using IBS using a power estimator per core intellectual property (IP) block. An IP block is a circuit area that performs a particular function. IP blocks may be in circuit libraries, may be provided as a synthesizable register transfer language (RTL) design. While cores themselves can be IP blocks, IP blocks can be smaller hardware blocks, such as encryption engines, caches, media decoders, function units such as arithmetic logic units (ALUs), prefetchers, decoders, reorder buffers, and reservation stations. FIG. 8 illustrates processor 801 with IP blocks 803a, 803b, and 803n. While only three blocks are shown, there may be dozens of IP blocks in a particular processor core. Each of the IP blocks, when used during an instruction, utilizes power that is related to capacitive switching activity that occurs in the IP block.

Dynamic energy usage in a circuit is related to the capacitance in the circuit and how many times that circuit switches. For each IP block, the estimated amount of energy utilized for a switching event can be determined based on simulation, empirical determinations on power consumption, or a combination to determine the amount of AC capacitance ($C_{AC}$) switched during an instruction's time in the pipeline. Every time that an IP block switches the IP block uses energy.

Rather than just record a cache or TLB miss or other microarchitectural event for the operation that is being sampled, the IBS sample can track $C_{AC}$ switching activity. Each switching event for a particular block uses a particular amount of energy. Thus, if a block switches for the instruction being sampled, a direct energy measurement may be made based on which core IP blocks switched. Tracking $C_{AC}$ switching events provides a more direct measurement of energy used compared to the approach shown in FIG. 7. Referring still to FIG. 8, each of the IP blocks has an associated $C_{AC}$ counter 805a, 805b, 805n. When the marked instruction and/or its operands (marked, e.g., by a $C_{AC}$ tracking control bit associated with the marked instruction and/or its operands) uses an IP block during execution, the switching counters 805a, 805b, 805n provide an indication of the usage. Embodiments store the contents of the switching counters as part of the instruction based sample data. For software energy debug applications on an instruction level basis, the hardware tracks the instructions through the various IP blocks in the core and the switching counters only indicate activity if the instructions being sampled caused that activity. Whether the IP block is active can be determined based on one or more input signals to the IP block, one or more internal signals in the IP block, or one or more output signals from the IP block. When the marked instruction utilizes an IP block, the block can internally track which circuits within the block are utilized. By reading out the count of times that particular circuits have switched (or whether they have switched at all), one can understand the switching activity within that block caused by that instruction. That can be more useful in gathering accurate information than simply detecting that an IP block as a whole was used. For instance, in an arithmetic logic unit, it may be useful to know that a floating point unit was utilized, and the switching activity was associated with the floating point unit, as this would use more power than if the integer logic unit was utilized. Thus, the switching counters 805 may contain an indication of particular circuits utilized within the IP block along with the count. Tracking switching activity with greater granularity can provide more accurate the energy estimates.

In an embodiment, a power estimator based on $C_{AC}$ switching events is expressed as a linear function of preselected weighted values associated with each IP block or parts of an IP block. The weights can be calculated to minimize the error when estimating the dynamic power based on detailed gate-level simulations of synthesized register transfer language (RTL) of the core IP. The core IP level at which power is estimated is adjustable and may depend on the level of granularity the end user wants to have in order to understand where the power is consumed when a certain piece of code is executed. The user can specify a subset of IP blocks to track for a particular IBS sample using a programming interface. For example, certain configurations may provide power tracking at a very fine granularity (e.g., information as to whether the ALU used floating point or integer operations), or it may be desirable to configure the energy debug hardware to provide more coarse-grained information (e.g., only that the ALU was used). Providing less information reduces the amount of storage needed to gather this information, and it may reduce the performance and energy overheads of gathering the instruction based samples. Thus, some users may accept less accurate energy estimates to reduce performance and energy overheads in gathering samples. Note that tracking some blocks may be less vital in determining an accurate measurement of energy. For instance, some blocks may use very little energy or may be used only for test and debug. By not selecting these blocks for analysis, and/or not providing support for energy debug of such hardware blocks at all, one can reduce design and verification time and/or reduce area and cost of the circuits used to provide energy debug.

The granularity of the energy consumption information provided to the user can vary according to user preference. The user can be presented with highly granular information of all IP blocks of interest that switched and associated energy usage or be provided overall energy usage for the tracked instruction by rolling up all the power usage for a sampled instruction into a single energy usage number such as shown in FIG. 3. The per IP core power estimates can be improved by adjusting the weights used to estimate gate-level power per IP block or by using linear regression to reduce the number of switching events associated with $C_{AC}$ in the linear function without significantly increasing the error.

Figure 9:
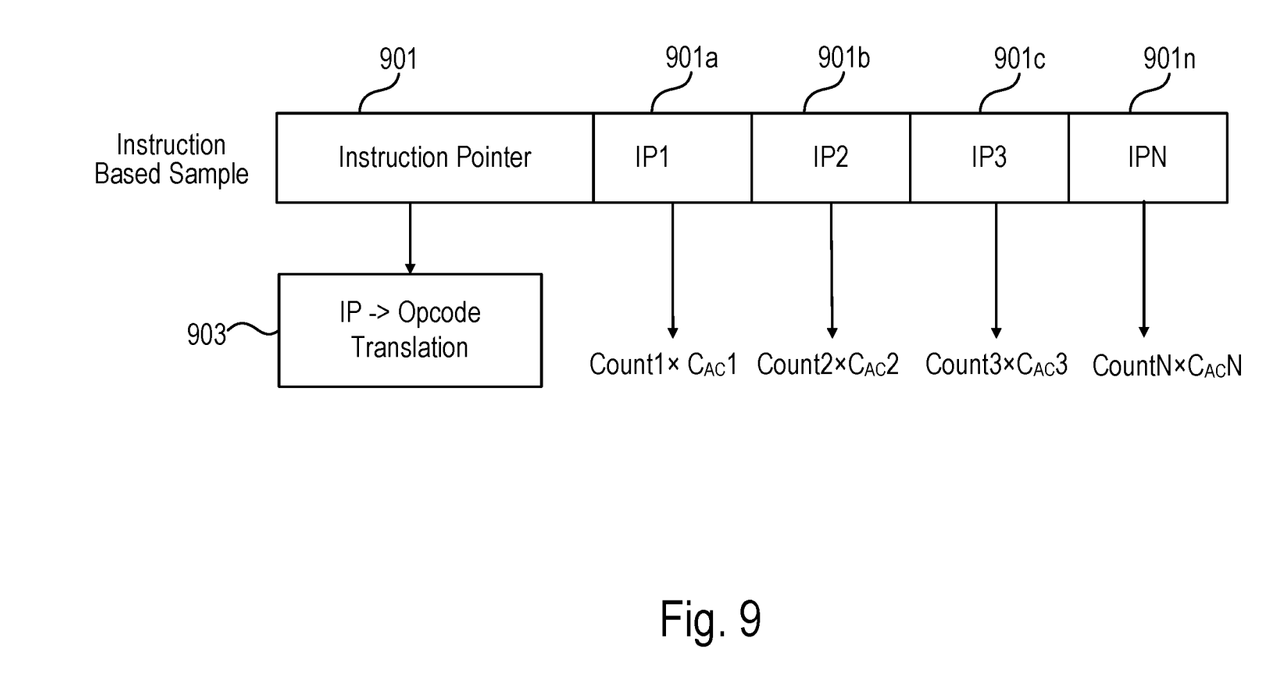
FIG. 9 illustrates an embodiment of a high level flow diagram for software to generate energy estimates based on $C_{AC}$ switching activity.

FIG. 9 illustrates an embodiment of a high level flow diagram for software to generate energy estimates using $C_{AC}$ switching activity. The sample data provided to the software operating in accordance with the flow diagram includes the instruction pointer 901. The actual instruction executed can be determined in 903, e.g., based on the bytes at that instruction pointer having been recorded as part of the sample data or by later looking up the bytes in the executable binary file. The sample data further includes data 901a, 901b, 901c, 901n from the $C_{AC}$ counters identifying switching activity in IP blocks due to execution of the sampled instruction. The software stores $C_{AC}$ information for each of the IP blocks and determines the energy for each IP block based on the switching activity and the stored $C_{AC}$. The IP blocks selected by the user that were used during instruction execution determines the energy usage estimate for the instruction and thus, $$\text{Total Energy} = \Sigma_{i=1}^{n} C_{AC} \times \text{switching activity}.$$

Thus, the embodiment utilizing $C_{AC}$ switching events generates power/energy consumption estimates for each sampled instruction or micro-op by tracking the events of the preselected IP blocks during the instruction's or micro-op's lifetime in the pipeline. The weights and the overall calculation can be hidden from the end user. Note that monitoring of $C_{AC}$ switching events does not differentiate between the energy consumed by the operation itself (base energy) and the energy of microarchitectural events, relevant to the operation. That hides the complexity of finding which microarchitectural events should be tied to the sampled operations from the user. For example, cache access energy cost for cacheable versus non-cacheable loads might vary, microcoded instructions will impose an energy cost accessing the microcode ROM unlike fastpath instructions, conditional branches might not fire branch predictors if dispatched by a loop buffer, issuing loads/stores can trigger accesses to power hungry address/value predictors, etc. Thus, the detail of microarchitectural events may still be valuable to a software energy debugger. Thus, some embodiments provide the ability for the energy debugger to have both the energy usage per selected IP block be provided along with the detail of microarchitectural events and energy usage associated with each of the microarchitectural events.

Instruction based samples can include microarchitectural data that is highly correlated with energy (so-called high-switching events). For example, energy-expensive logical and mathematical operations include double-precision floating point operations, divide instructions, and vector operations, internal out-of-order microarchitecture events that require table lookups such as how many times an instruction in a reorder buffer is polled before it is committed, and transactions on large data busses. These operations are known by hardware designers at design time and signals indicating the operations can be sampled during instruction based sampling like any other microarchitectural signal. The instruction based samples can also be augmented with other information gathered from the hardware or software, such as measured or estimated temperature when the instruction based sample is gathered, other non-precise performance counters, or software-level statistics such as the conflict level of a lock. In addition, the instruction based sample can include the power state in which the core is operating at the time of the sample including such information as, e.g., the Advanced Configuration and Power Interface (ACPI) state, core voltage, and core frequency.

The approaches described herein may also be used to estimate whole-program energy usage because of the random sampling nature of tools like instruction based sampling. As explained above, by multiplying the data in a sample by energy weights, by looking up the executed instructions in a 'base energy' table, and then adding these values together, one can generate an estimate of the energy that the sampled operation spent executing on the processor. Because this operation was randomly sampled every $N^{th}$ op, the op will occur in rough proportion to number of times it was sampled vs. all other samples. For instance, if a particular op made up ½ of the 1 million IBS samples taken, and each sample was taken roughly every $4000^{th}$ op, then one could make the estimate that this op was executed roughly 2 billion times (1,000,000×4,000×½). Thus, multiplying each of the 500,000 energy estimates by 4,000 could be done to estimate the total energy used by the op as the application ran. Note that generating the power estimates from the instruction level samples using $C_{AC}$ switching can also be used to calculate whole program energy usage.

Energy usage derived microarchitectural events as shown in FIG. 7 or based on $C_{AC}$ switching events can also be used to map energy usage to time. Thus, sample data can also be augmented by including time stamp information. By grouping collections of instruction based samples with nearby (in time) timestamps, energy estimates can be made over short timescales by selecting a range of timestamps corresponding to the desired time scale.

By mapping runtime energy usage to the static instructions, it becomes possible to know the energy usage of parts of a program. This ranges from the instruction granularity to functions, libraries, and whole programs. Because memory operations can cause a significant amount of energy usage, instruction based samples that point to particular data structures (since sample data for memory ops include the address being accessed) can be used to assign energy statistics to particular data structures. That may help developers find optimization opportunities not just based on code patterns.

Because IBS samples contain data that can infer where energy is used (e.g., cache misses burn energy in the memory system), the sampling techniques described herein can be used to understand in which IP block or hardware structure energy is spent. That may help hardware developers design pipelines with higher energy efficiency, or it may be useful for programmers to understand future purchasing decisions (for example) or modify the source code of their applications to reduce the energy footprint (e.g., by modifying hot loops to fit inside the micro-op cache or the loop buffer or by restructuring hot data structures (e.g. blocking) to fit in the data cache).

Embodiments described herein can be useful in numerous domains in computing, such as embedded and mobile, servers, and desktops. Besides showing how to gather instruction-level CPU/GPU power for developers, it is also useful for finding high-energy microarchitectural structures that may need to be optimized in future core generations. Rather than using small traces, energy debugging as described herein allows software developers to more quickly understand where energy is being spent in full-sized applications of interest. Designers of various types of processors can include the power debugging features described herein allowing determination of energy usage on a per-instruction basis to help identify high-energy events and provide power debugging for software operating on the processors.

Thus, embodiments have been described that provide greater capability in debugging energy usage in software. The description set forth herein is illustrative, and is not intended to limit the scope of the following claims. Other variations and modifications of the embodiments disclosed herein, may be made based on the description set forth herein, without departing from the scope set forth in the following claims.

What is claimed is:

1. A method comprising:
   marking an operation to sample in a processor, the operation associated with an instruction to be executed in the processor, the operation being marked responsive to one or more settings of an instruction based sampling (IBS) operation control register in the processor; and
   sampling data in the processor on a per instruction basis during execution of the operation to generate sampling data for the operation that was marked, the sampling data indicating utilization of processor hardware during the execution of the operation.

2. The method as recited in claim 1 wherein the sampling data indicates the utilization of the processor hardware by indicating microarchitectural events associated with the execution of the operation.

3. The method as recited in claim 2 further comprising:
   determining an estimate of energy utilized by the execution of the operation based on the sampling data, wherein determining the estimate includes,
      assigning a base energy amount according to the instruction that was executed; and
      adjusting the base energy amount according to the utilization of processor hardware indicated in the sampling data.

4. The method as recited in claim 3 wherein determining the estimate further comprises:
multiplying each of the microarchitectural events indicated in the sampling data by respective energy weights corresponding to the microarchitectural events to generate an energy adjustment and adding the energy adjustment to the base energy amount.

5. The method as recited in claim 1 further comprising storing an instruction pointer or an opcode associated execution of the operation in the sampling data.

6. The method as recited in claim 1 further comprises:
tracking switching events in a hardware block of the processor utilized during the execution of the instruction by incrementing a counter associated with the hardware block responsive to a switching event occurring in the hardware block; and
storing a count value of the counter in the sampling data.

7. The method as recited in claim 1 further comprising configuring the IBS operation control register to sample every N operations, every N instructions, every N operations of a particular type, every N operations that utilizes a particular hardware resource, every N operations within a particular range of addresses, or every N clock cycles, where N is an integer.

8. The method as recited in claim 1 further comprising generating and storing a timestamp associated with the sampling data.

9. The method as recited in claim 1 further comprising the processor storing as part of the sampling data at least one of temperature, voltage, frequency, or power state associated with the processor at a time the sampling data was sampled.

10. The method as recited in claim 1 further comprising:
responsive to an operation committing, storing the sampling data in memory.

11. The method as recited in claim 1 further comprising sampling a fetch operation associated with the instruction responsive to one or more settings of an instruction based sampling fetch control register.

12. A computer system comprising:
a processor;
an instruction based sampling (IBS) operation control register in the processor that causes a selected operation to be marked responsive to configuration of the IBS operation control register and the processor is configured to generate sampling data for the selected operation as the selected operation executes, the sampling data including a plurality of fields indicating processor hardware utilized due to execution of the selected operation on the processor; and
storage to store the sampling data.

13. The computer system as recited in claim 12 wherein the processor further comprises:
a plurality of hardware blocks;
a plurality of counters respectively associated with the plurality of hardware blocks to track switching events in the hardware blocks; and
wherein a respective one of the counters changes its count value responsive to detection of a respective one of the switching events in an associated one of the hardware blocks.

14. The computer system as recited in claim 13 wherein the processor determines a switching event to take place in the associated one of the hardware blocks based on one or more input signals to the associated one of the hardware blocks, one or more internal signals in the associated one of the hardware blocks, or one or more output signals of the associated one of the hardware blocks.

15. The computer system as recited in claim 12,
wherein responsive to the selected operation committing, the computer system stores the sampling data in the storage.

16. The computer system as recited in claim 15,
wherein an interrupt is generated responsive to the selected operation committing; and
responsive to the interrupt, the computer system stores the sampling data.

17. The computer system as recited in claim 12 further comprising an instruction based sampling fetch control register to control sampling of fetches associated with a particular instruction and wherein the processor is configured to provide instruction fetch based sampling data along with the sampling data for the selected operation.

18. The computer system as recited in claim 12 wherein the IBS operation control register is configurable to cause the processor to sample every N operations, every N instructions, every N operations of a particular type, every N operations that utilizes a particular hardware resource, every N operations within a particular range of addresses, or every N clock cycles, where N is an integer.

19. A method comprising:
generating sampling data in a processor on a per instruction basis during execution of an instruction on the processor responsive to configuration of an operation sampling control register in the processor, the sampling data indicating utilization of processor hardware due to the execution of the instruction;
providing instruction fetch based sampling data and instruction execution based sampling data as part of generating the sampling data; and
responsive to an operation committing, storing the instruction fetch based sampling data and instruction execution based sampling data in memory.

20. The method as recited in claim 19 further comprising determining an estimate of energy utilized by the execution of the instruction based on the sampling data for the instruction.

* * * * *